(12) United States Patent
Kim

(10) Patent No.: US 9,653,518 B2
(45) Date of Patent: May 16, 2017

(54) LIGHT-EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventor: Yong Il Kim, Yongin-si (KR)

(73) Assignee: SAMSUNG DISPLAY CO., LTD., Yongin, Gyeonngi-Do (KR)

( * ) Notice: Subject to any disclaimer, the term of this patent is extended or adjusted under 35 U.S.C. 154(b) by 0 days.

(21) Appl. No.: 14/823,489

(22) Filed: Aug. 11, 2015

(65) Prior Publication Data
US 2016/0293675 A1    Oct. 6, 2016

(30) Foreign Application Priority Data
Apr. 3, 2015 (KR) .......................... 10-2015-0047389

(51) Int. Cl.
*H01L 27/32* (2006.01)
*H01L 51/00* (2006.01)
(Continued)

(52) U.S. Cl.
CPC ...... *H01L 27/3211* (2013.01); *H01L 27/3223* (2013.01); *H01L 27/3246* (2013.01); *H01L 51/0004* (2013.01); *H01L 51/0005* (2013.01); *H01L 51/56* (2013.01); *H01L 51/5012* (2013.01); *H01L 51/5056* (2013.01); *H01L 51/5088* (2013.01)

(58) Field of Classification Search
None
See application file for complete search history.

(56) References Cited

U.S. PATENT DOCUMENTS

2008/0150425 A1* 6/2008 Cho .................. H05B 33/22
                                                            313/506
2012/0009703 A1* 1/2012 Feinstein ............ G02F 1/1333
                                                            438/28

FOREIGN PATENT DOCUMENTS

JP         2009-081097 A  *   4/2009
KR    10-2006-0041919 A       5/2006
(Continued)

OTHER PUBLICATIONS

Reid Chesterfield, et al., Solution-Coating Technology for AMOLED Displays, Information Display 1/11, pp. 24-30, 2011.

*Primary Examiner* — Eva Y Montalvo
*Assistant Examiner* — Kevin Quinto
(74) *Attorney, Agent, or Firm* — Lee & Morse, P.C.

(57) ABSTRACT

A light-emitting display device and a method of manufacturing the same including preparing a substrate such that the substrate includes a pixel area and a seal area; forming first pixel electrode patterns on the substrate; forming insulating patterns on the pixel area and the seal area; forming hole injection patterns on the pixel area and the seal area; forming surface treatment patterns on the pixel area and the seal area; forming light-emitting patterns on the pixel area and the seal area; and forming second pixel electrode patterns on the pixel area, wherein forming the surface treatment patterns includes forming the surface treatment patterns on the pixel area and the seal area such that the surface treatment patterns and the hole injection patterns can be alternately arranged on the top surface of the pixel area, and that only the surface treatment patterns can be arranged on the top surface of the seal area.

20 Claims, 19 Drawing Sheets

(51) Int. Cl.
 *H01L 51/56* (2006.01)
 *H01L 51/50* (2006.01)

(56) References Cited

FOREIGN PATENT DOCUMENTS

KR   10-2006-0063145 A   6/2006
 KR   10-2011-0005594 A   1/2011
 KR   10-2011-0059255 A   6/2011

\* cited by examiner

LIGHT-EMITTING DISPLAY DEVICE AND METHOD OF MANUFACTURING THE SAME

CROSS-REFERENCE TO RELATED APPLICATION

Korean Patent Application No. 10-2015-0047389, filed on Apr. 3, 2015, in the Korean Intellectual Property Office, and entitled: "Light-Emitting Display Device and Method of Manufacturing the Same," is incorporated by reference herein in its entirety.

BACKGROUND

1. Field

Embodiments relate to a light-emitting display device and a method of manufacturing the same.

2. Description of the Related Art

An organic light-emitting diode (OLED) display device, which is a type of light-emitting display device, is a self-emitting display device. The OLED display device includes an organic light-emitting layer interposed between an anode electrode and a cathode electrode. The two electrodes inject electrons and holes into the organic light-emitting layer, and the electrons and holes are combined together, thereby generating excitons. In response to the transition of the excitons from an excited state to a ground state, the organic light-emitting layer emits light, and as a result, an image is displayed.

The OLED display device has various benefits, such as high emission efficiency, high luminance, wide viewing angles, and high response speed, compared to other display devices.

SUMMARY

Embodiments are directed to a light-emitting display device and a method of manufacturing the same.

The embodiments may be realized by providing a method of manufacturing a light-emitting display device, the method including preparing a substrate such that the substrate includes: a pixel area in which a plurality of pixels are arranged, and a seal area that surrounds the pixel area; forming first pixel electrode patterns on the substrate where the pixel area is defined; forming insulating patterns on the pixel area and the seal area where the first pixel electrode patterns are formed; forming hole injection patterns on the pixel area and the seal area where the insulating patterns are formed; forming surface treatment patterns on the pixel area and the seal area where the hole injection patterns are formed; forming light-emitting patterns on the pixel area and the seal area where the surface treatment patterns are formed; and forming second pixel electrode patterns on the pixel area where the light-emitting patterns are formed, wherein forming the surface treatment patterns includes forming the surface treatment patterns on the pixel area and the seal area such that the surface treatment patterns and the hole injection patterns can be alternately arranged on the top surface of the pixel area, and that only the surface treatment patterns can be arranged on the top surface of the seal area.

The hole injection patterns may be formed of a lyophobic material, and the surface treatment patterns may be formed of a lyophilic material.

The surface treatment patterns may be formed of a conductive primer.

Forming the light-emitting patterns may include forming the light-emitting patterns using one of an inkjet printing method or a nozzle printing method.

Forming the surface treatment patterns may include forming a plurality of grooves to define the pixels arranged in the pixel area and to expose the hole injection patterns therethrough.

Forming the light-emitting patterns may further include forming a hole transport layer on the pixel area and the seal area where the surface treatment patterns are formed; and forming a light-emitting layer on the pixel area and the seal area where the hole transport layer is formed.

The method may further include, after the forming the second pixel electrode patterns etching the hole injection patterns, the surface treatment patterns, and the light-emitting patterns from the seal area by using the second pixel electrode patterns as a pattern mask.

The embodiments may be realized by providing a method of manufacturing a light-emitting display device, the method including preparing a substrate such that the substrate includes a pixel area in which a plurality of pixels are arranged, and a seal area that surrounds the pixel area; forming first pixel electrode patterns on the substrate where the pixel area is defined; forming insulating patterns on the pixel area and the seal area where the first pixel electrode patterns are formed; forming hole injection patterns on the pixel area and the seal area where the insulating patterns are formed; forming surface treatment patterns on the pixel area and the seal area where the hole injection patterns are formed; etching the surface treatment patterns from the seal area so as to expose the hole injection patterns on a top surface of the seal area; forming light-emitting patterns on the pixel area; and forming second pixel electrode patterns on the pixel area where the light-emitting patterns are formed.

The hole injection patterns may be formed of a lyophobic material, and the surface treatment patterns may be formed of a lyophilic material.

The surface treatment patterns may be formed of a conductive primer.

Forming the light-emitting patterns may include forming the light-emitting patterns using one of an inkjet printing method and a nozzle printing method.

Etching the surface treatment patterns may include etching the surface treatment patterns from the seal area and, at the same time, forming a plurality of grooves to define the pixels arranged in the pixel area and to expose the hole injection patterns therethrough.

Forming the light-emitting pattern may further include forming a hole transport layer on the pixel area and the seal area where the surface treatment patterns are formed; and forming a light-emitting layer on the pixel area and the seal area where the hole transport layer is formed.

The pixel area may include a display area in a middle of the substrate, and a dummy area between the display area and the seal area, and the light-emitting patterns of the pixels in the display area are formed to have different heights from the light-emitting patterns of the pixels in the dummy area.

Pixels in the dummy area may be formed to be higher than pixels in the display area.

The method may further include, after forming the second pixel electrode patterns, etching the hole injection patterns from the seal area by using the second pixel electrode patterns as a pattern mask.

The embodiments may be realized by providing a light-emitting display device including a pixel area, the pixel area including a plurality of display pixels in a middle of a substrate, and a plurality of dummy pixels surrounding the display pixels; and a seal area surrounding pixel area and having a sealant formed therein, wherein the display pixels include first light-emitting patterns, the dummy pixels include second light-emitting patterns that emit same colors as the first light-emitting patterns, and the first light-emitting patterns have a smaller height than the second light-emitting patterns that are disposed near the seal area.

Each of the first light-emitting patterns and the second light-emitting patterns may include a hole transport layer delivering holes provided thereto from an anode electrode formed on the substrate; and a light-emitting layer formed on the hole transport layer and emitting light.

The seal area is treated so as for the top surface thereof to have lyophobicity, before formation of the sealant.

The sealant may be frit that includes fine glass particles.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
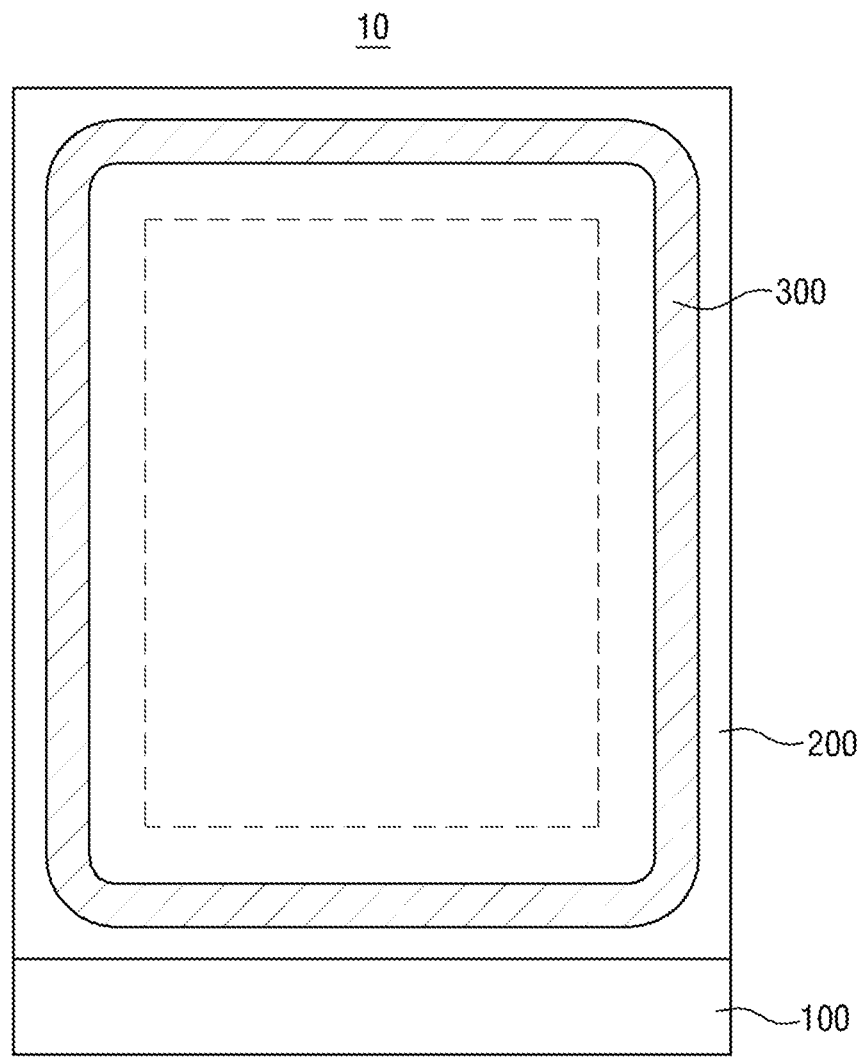
FIG. 1 illustrates a plan view of a light-emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be under stood that when an element or layer is referred to as being "on", "connected to", "coupled to", or "adjacent to" another element of layer, it can be directly on, connected to, coupled to, or adjacent to the other element or layer, or one or more intervening elements or layers may be present. In contrast, when an element is referred to as being "directly on", "directly connected to", "directly coupled to", or "immediately adjacent to" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element of feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the embodiments. Accordingly, the exemplary views may be modified depending on manufacturing technologies and/or tolerances. Therefore, the embodiments are not limited to those shown in the views, but include modifications in configuration formed on the basis of manufacturing processes. Therefore, regions that are exemplified in the figures have exemplary schematic properties and shapes and do not limit the embodiments to only those exemplary schematic properties and shapes.

Figure 2:
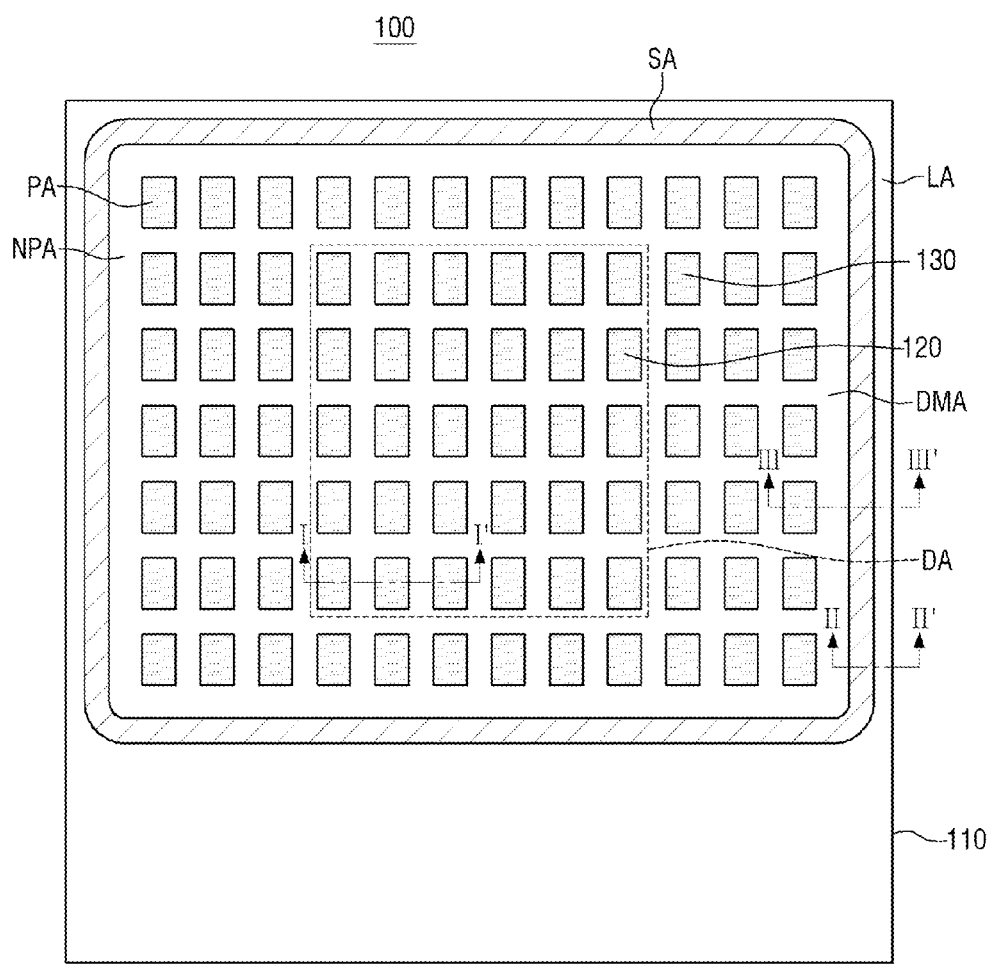
FIG. 2 illustrates a plan view of a display substrate illustrated in FIG. 1.

FIG. 1 illustrates a plan view of a light-emitting display device according to an exemplary embodiment. FIG. 2 illustrates a plan view of a display substrate illustrated in FIG. 1.

Referring to FIG. 1, a light-emitting display device 10 may include a display substrate 100, an encapsulating substrate 200, and a sealant 300.

Referring to FIG. 2, the display substrate 100 may include a display area DA, a dummy area DMA, a seal area SA, and a line area LA.

The display area DA may be disposed at a center of the display substrate 100.

The display area DA may include a plurality of pixels 120 to display an image therein. Each of the pixels 120 may emit light of a particular color. For example, the pixels 120 may include red (R) pixels, green (G) pixels, and blue (B) pixels.

The dummy area DMA may surround the display area DA. The dummy area DMA may include a plurality of pixels 130. The pixels 130 may include R pixels, G pixels, and B pixels. The pixels 130 may be provided in the dummy area DMA not for displaying an image, but for testing the pixels 120 in the display area DA.

The surfaces of the display area DA and the dummy area DMA may be divided into pattern areas PA and a non-pattern area NPA.

The pattern areas PA may be areas in which to form organic patterns for forming R pixels, G pixels, and B pixels. The surfaces of the pattern areas PA may be treated with a lyophilic material. Light-emitting patterns for forming R pixels, G pixels, and B pixels may be formed in areas that are treated to have lyophilicity, and the areas may be defined as the pattern areas PA. The surfaces of the pattern areas PA may be treated to have lyophilicity, and the pattern areas PA may also be referred to as lyophilic areas.

The non-pattern area NPA may be an area for defining the pixels 120 and the pixels 130. For example, the non-pattern area NPA may be an area for preventing R pixels, G pixels, and B pixels from being mixed with one another. For example, no such organic patterns (as light-emitting patterns) may be formed in the non-pattern area NPA. The surface of the non-pattern area NPA may be treated with a lyophobic material. The lyophobic material may be a material having little affinity for an organic material so as to repel the organic material. For example, a lyophobic material may have little affinity for a liquid (e.g., an organic liquid), and may repel the liquid (e.g., organic liquid). In contrast, a lyophilic material may be a material having an affinity for an organic material so as to be attracted to the organic material. For example, a lyophilic material may have an affinity for a liquid (e.g., an organic liquid), and may be attracted to the liquid (e.g., organic liquid). The surface of the non-pattern area NPA may be treated to have lyophobicity, and the non-pattern area NPA may also be referred to as a lyophobic area.

Pixels 120 (emitting light of a particular color in the display area DA) may be formed to have a height (e.g., taken from an anode or underlying layer) or thickness that is different from their counterparts in the dummy area DMA, e.g., pixels 130 emitting light of the particular color. For example, light-emitting patterns corresponding to R pixels 120 in the display area DA may have a different height from light-emitting patterns corresponding to R pixels 130 in the dummy area DMA. Similarly, G pixels 120 in the display area DA may have a different height from G pixels 130 in the dummy area DMA, and B pixels 120 in the display area DA may have a different height from B pixels 130 in the dummy area DMA. For example, light-emitting patterns corresponding to R pixels 130 in part of the dummy area DMA within close vicinity of or adjacent to the seal area SA may be higher, taller, or thicker than the light-emitting patterns corresponding to the R pixels 120 in the display area DA. The light-emitting patterns corresponding to the R pixels 130 may be formed to be higher, taller, or thicker than the light-emitting patterns corresponding to the R pixels 120 because the surface of the seal area may be treated to have lyophobicity. In response to the surface of the seal area SA being treated to have lyophobicity, a light-emitting pattern solution (e.g., liquid or organic liquid) for forming light-emitting patterns, including R pixels, G pixels, and B pixels that are formed by inkjet printing or nozzle printing, may flow into the dummy area DMA, instead of being formed or remaining on the surface of the seal area SA. Accordingly, the pixels 130 in the dummy area DMA that are near, adjacent, or proximate to the seal area SA may be formed to be higher or thicker than the pixels 120 in the display area DA.

The seal area SA may surround the dummy area DMA. The sealant 300, which bonds the display substrate 100 and the encapsulating substrate 200, may be disposed on the sealant area SA. In order for the sealant 300 to be uniformly formed, an entire surface of the seal area SA may be treated with a lyophilic material or a lyophobic material or an entire surface of the seal area SA may be imparted to have lyophilic or lyophobic properties. For example, in the seal area SA, unlike in the display area DA and the dummy area DMA, a lyophilic area and a lyophobic area may not coexist. Accordingly, the seal area SA may have a uniform surface. As a result, the sealant 300 may be formed on the seal area SA to have a uniform shape. Accordingly, the sealing of the light-emitting display device 10 may be improved.

The line area LA may be disposed near the seal area SA. In the line area LA, metal lines providing electric signals (such as data signals, test signals, or scan signals to the pixels 120 in the display area DA or the pixels 130 in the dummy area DMA) may be provided. The structure of the display substrate 100 will be described below in further detail with reference to FIGS. 3 and 4.

The encapsulating substrate 200 may be disposed to face the display substrate 100. The encapsulating substrate 200 may have a smaller size than the display substrate 100. The encapsulating substrate 200 may cover the top of the display substrate 100 with the aid of the sealant 300, which is formed along the seal area SA of the display substrate 100.

The sealant 300 may integrally bond the display substrate 100 and the encapsulating substrate 200 together. The sealant 300 may include frit that includes fine glass particles. The frit, which may be in the form of a gel or paste, may be applied onto the edges of the encapsulating substrate 200, e.g., part of the encapsulating substrate 200 corresponding to the seal area SA of the display substrate 100, and may be irradiated with laser beams so as to be melted and cured with the energy of the laser beams. The fine glass particles of the frit may include, e.g., at least one of magnesium oxide (MgO), barium oxide (BaO), lithium oxide (LiO$_2$), tin oxide (SnO), phosphate (P$_2$O$_5$), ferrite oxide (Fe$_2$O$_3$), titanium oxide (TiO$_2$), tungsten oxide (WO$_3$), lead-borate glass, tin-phosphate oxide, vanadate glass, and borosilicate.

An exemplary embodiment where the surface of the seal area SA of the display substrate 100 is treated with a lyophilic material will hereinafter be described with reference to FIGS. 3 to 14.

Figure 3:
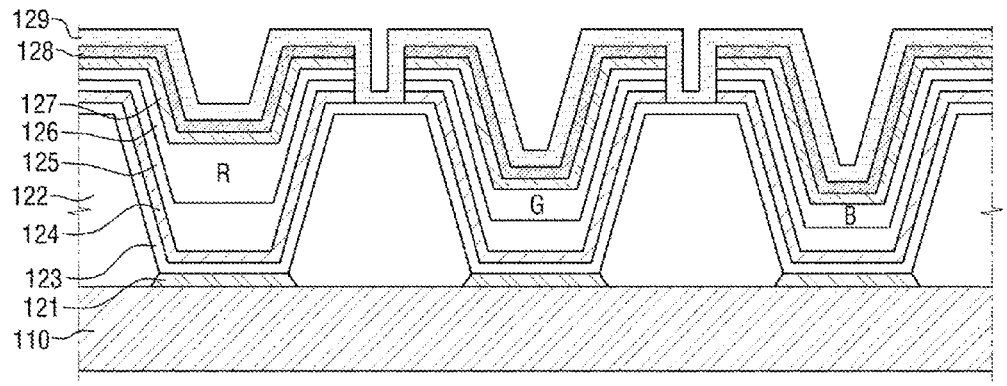
FIG. 3 illustrates a cross-sectional view of a display substrate according to a first exemplary embodiment, taken along line I-I' of FIG. 2.
Figure 4:
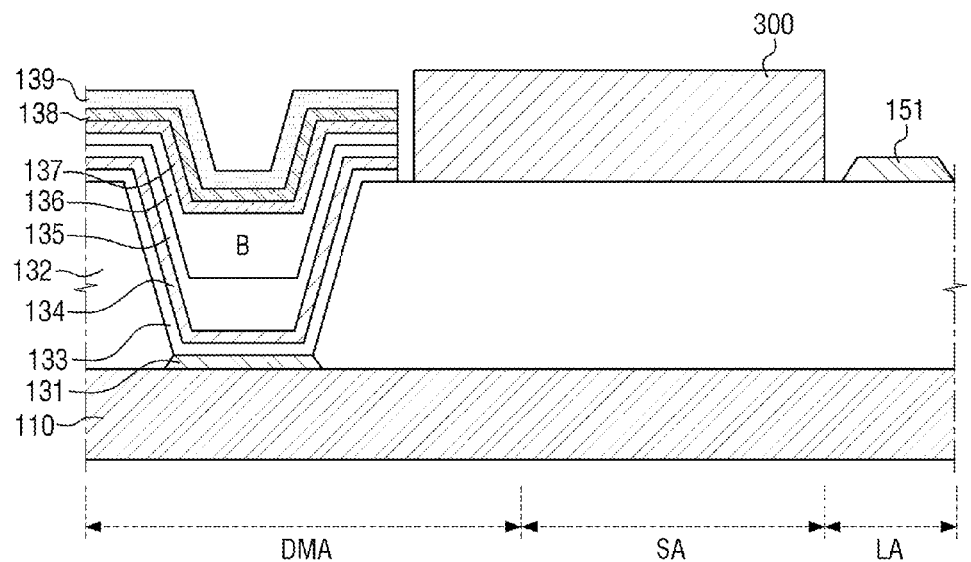
FIG. 4 illustrates a cross-sectional view of the display substrate according to the first exemplary embodiment, taken along line II-II' of FIG. 2.

FIG. 3 illustrates a cross-sectional view of a display substrate according to a first exemplary embodiment, taken along line I-I' of FIG. 2. FIG. 4 illustrates a cross-sectional view of the display substrate according to the first exemplary embodiment, taken along line II-II' of FIG. 2.

Referring to FIGS. 3 and 4, a display substrate 100 may include a display area DA, a dummy area, a seal area SA, and a line area LA.

Referring to FIG. 3, the display area DA may include a plurality of pixels 120, and each of the pixels 120 may include a first anode electrode 121, a first pixel-defining layer 122, a first hole injection layer 123, a first surface treatment layer 124, a first hole transport layer 125, a first light-emitting layer 126, a first electron transport layer 127, a first electron injection layer 128, and a second cathode electrode 129, which are disposed on a substrate 110.

The substrate 110 may be an insulating substrate. In an implementation, the substrate 110 may be formed of a transparent glass material having a transparent SiO$_2$ material as a main ingredient thereof. In an implementation, the substrate 110 may be formed of an opaque material or a plastic material. The substrate 110 may be a flexible substrate. In an implementation, the substrate 110 may include structures formed on an insulating substrate. Examples of the structures formed on the insulating substrate may include lines, electrodes, and insulating layers. In an implementation, the substrate 110 may include a plurality of thin-film transistors (TFTs) formed on an insulating substrate. The drain electrode of at least one of the TFTs may be electrically connected to the first anode electrode 121. Each of the TFTs may include an active area formed of amorphous silicon, polycrystalline silicon, or monocrystalline silicon. In an implementation, each of the TFTs may include an active area formed of an oxide semiconductor.

The first anode electrode 121 may be formed on the substrate 110 in the display area DA for each of the pixels 120. The first anode electrode 121 may receive a signal applied to the drain electrode of a TFT and may provide holes to the first light-emitting layer 126. The first anode electrode 121 may be a transparent electrode or a reflective electrode. In a case when the first anode electrode 121 is a transparent electrode, the first anode electrode 121 may be formed of indium tin oxide (ITO), indium zinc oxide (IZO), zinc oxide (ZnO) or indium oxide (In$_2$O$_3$). In an implementation, in a case when the first anode electrode 121 is used as a reflective electrode, the first anode electrode 121 may be formed by forming a reflective layer using silver (Ag), magnesium (Mg), aluminum (Al), platinum (Pt), palladium (Pd), gold (Au), nickel (Ni), neodymium (Nd), iridium (Ir), chromium (Cr), or a compound thereof and forming ITO, IZO, ZnO, or $In_2O_3$ on the reflective layer.

The first pixel-defining layer 122 may define the pixels 120 on the substrate 10 in the display area DA, and may include an opening through which the top of the first anode electrode 121 is exposed. The first pixel-defining layer 122 may be formed of an insulating material. For example, the first pixel-defining layer 122 may include an inorganic material such as silicon nitride. In an implementation, the first pixel-defining layer 122 may include at least one organic material selected from benzocyclobutene (BCB), polyimide (PI), polyamide (PA), an acrylic resin, or a phenol resin.

The first hole injection layer 123 may be formed on the first anode electrode 121 exposed through the opening of the first pixel-defining layer 122 and on the sidewalls of the opening of the first pixel-defining layer 122 to cover the entire top of the first pixel-defining layer 122. The first hole injection layer 123 may serve as a buffer layer for lowering the energy barrier between the first anode electrode 121 and the first hole transport layer 125 and may allow holes provided by the first anode electrode 121 to be easily injected into the first hole transport layer 125. The first hole injection layer 123 may be formed of a lyophobic material. In an implementation, the first hole injection layer 123 may be formed by slit coating.

The first surface treatment layer 124 may be formed on the first hole injection layer 123 for each of the pixels 120. For example, the first surface treatment layer 124 may be formed on the first hole injection layer 123 exposed through the opening of the first pixel-defining layer 122 and on the sidewalls of the opening of the first pixel-defining layer 122 to cover the entire top of the first pixel-defining layer 122 where the first hole injection layer 123 is formed, and to define each of the pixels 120. In a case when the pixels 120 are formed by inkjet printing or nozzle printing, a hole transport layer solution may be ejected onto the first surface treatment layer 124 to form the first hole transport layer 125. The hole transport layer may have a high wettability with respect to the first surface treatment layer 124, and the hole transport layer solution may be stably contained within each of the pixels 120 without spreading to the top of the first pixel-defining layer 122. As a result, the first hole transport layer 125 may be uniformly formed on the first surface treatment layer 124. The expression "high wettability", as used herein, may indicate that a liquid or a solution may spread widely over the surface of a solid and may thus have a large area of contact with the solid. The first surface treatment layer 124 may be formed of a conductive primer so as to be more lyophilic than the first hole injection layer 123 with respect to the hole transport layer solution.

The first hole transport layer 125 may be conformally formed on the first surface treatment layer 124. The first hole transport layer 125 may deliver holes provided from the first hole injection layer 123 via the first surface treatment layer 124 to the first light-emitting layer 126. The first hole transport layer 125 may be formed of an organic compound, e.g., N,N'-diphenyl-N,N'-bis(3-methylphenyl)-1,1'-bi-phenyl-4,4'-diamine (TPD), or N,N'-di(naphthalen-1-yl)-N,N'-diphenylbenzidine (NPB). The first hole transport layer 125 may be formed by inkjet printing or nozzle printing.

The first light-emitting layer 126 may be conformally formed on the first hole transport layer 125. The first light-emitting layer 126 may recombine holes provided by the first anode electrode 121 and electrons provided by the first cathode electrode 129 therein and may thus emit light. For example, holes and electrons provided to the first light-emitting layer 126 may be recombined with each other, thereby generating excitons. Then, in response to the transition of the excitons from an excited state to a ground state, light may be emitted. The first light-emitting layer 126 may include an red light-emitting layer R, a green light-emitting layer G, and a blue light-emitting layer B.

The red light-emitting layer R may include a red light-emitting material alone or may include a host and a red dopant. For example, tris(8-hydroxyquinolinato)aluminum ($Alq_3$), 4,4'-N,N'-dicarbazol-biphenyl (CBP), ploy(n-vinyl-carbazole) (PVK), 9,10-Di(naphthyl-2-yl)anthracene (ADN), TCTA, 1,3,5-tris(N-phenylbenzimidazol-2-yl)ben-zene (TPBI), 3-tert-butyl-9,10-di(naphth-2-yl)anthracene (TBADN), E3, or distyrylarylene (DSA) may be used as the host of the red light-emitting layer R. For example, PtOEP, $Ir(piq)_3$, or $Btp_2Ir(acac)$ may be used as the dopant of the red light-emitting layer R.

The green light-emitting layer G may include a green light-emitting material alone or may include a host and a green dopant. The same material as that used as the host of the red light-emitting layer R may also be used as the host of the green light-emitting layer G. For example, $Ir(ppy)_3$, $Ir(ppy)_2(acac)$ or $Ir(mpyp)_3$ may be used as the dopant of the green light-emitting layer G.

The blue light-emitting layer B may include a blue light-emitting material alone or may include a host and a blue dopant. The same material as that used as the host of the red light-emitting layer R may also be used as the host of the blue light-emitting layer B. For example, $F_2Irpic$, $(F_2ppy)_2Ir(tmd)$, $Ir(dfppz)_3$, ter-fluorene, 4,4'-bis(4-diphenylamino styryl) biphenyl (DPAVBi) or 2,5,8,11-tetra-t-butyl-perylene (TBPe) may be used as the dopant of the blue light-emitting layer B.

The first light-emitting layer 126 may be formed by inkjet printing or nozzle printing. As illustrated in FIG. 3, the R light-emitting layer R, the G light-emitting layer G, and the B light-emitting layer B of the first light-emitting layer 126 may be formed to have different heights or thicknesses relative to one another in consideration that the wavelength of light varies from one color to another color.

The first electron transport layer 127 may be conformally formed on the first light-emitting layer 126. The first electron transport layer 127 may deliver electrons provided by the first cathode electrode 129 via the first electron injection layer 128 to the first light-emitting layer 126. The first electron transport layer 127 may be formed of an organic compound, e.g., 4,7-diphenyl-1,10-phenanthroline (Bphen), BAlq, $Alq_3$, beryllium bis(benzoquinolin-10-olate) ($Bebq_2$), or TPBI. The first electron transport layer 127 may be formed by deposition.

The first electron injection layer 128 may be conformally formed on the first electron transport layer 127. The first electron injection layer 128 may serve as a buffer layer for lowering the energy barrier between the first electron transport layer 127 and the first cathode electrode 129 and may allow electrons provided by the first cathode electrode 129 to be easily injected into the first electron transport layer 127. The first electron injection layer 128 may be formed of, e.g., lithium fluoride (LiF) or cesium fluoride (CsF). The first electron injection layer 128 may be formed by deposition.

The first cathode electrode 129 may be formed on the first electron injection layer 128, and may provide electrons to the first light-emitting layer 126. The first cathode electrode 129, like the first anode electrode 121, may be a transparent electrode or a reflective electrode and may be formed by deposition.

Referring to FIG. 4, the dummy area DMA may include a plurality of pixels 130, and each of the pixels 130 may include a second anode electrode 131, a second pixel-defining layer 132, a second hole injection layer 133, a second surface treatment layer 134, a second hole transport layer 135, a second light-emitting layer 136, a second electron transport layer 137, a second electron injection layer 138, and a second cathode electrode 130, which are disposed on the substrate 110. The pixels 130 may be formed in the dummy area DMA during, or in connection with, the formation of the pixels 120 in the display area DA, and may have the same structure as the pixels 120. Accordingly, a detailed description of the structure of the pixels 130 will be omitted.

The seal area SA may be disposed near the dummy area DMA of the display substrate 100. As illustrated in FIG. 4, the second pixel-defining layer 132 may be formed on the substrate 110 to extend from the dummy area DMA into the seal area SA. A sealant 300 for bonding the display substrate 100 and an encapsulating substrate 200 together may be formed on the second pixel-defining layer 132 of the seal area SA. The second pixel-defining layer 132 may be formed on the seal area SA to have a uniform thickness.

The line area LA may be disposed near the seal area SA. As illustrated in FIG. 4, the second pixel-defining layer 132 may be formed on the substrate 110 to extend from the dummy area DMA into the line area LA, and a line 151 may be formed on the second pixel-defining layer 132 of the line area LA. The line 151 may receive a signal applied thereto from an external driving integrated circuit (IC) and may apply the received signal to the display area DA or the dummy area DMA. The line 151 may be formed of a metal material, e.g., Ag, Mg, Al, Pt, Pd, Au, Ni, Nd, Ir, Cr, or a compound thereof.

A method of manufacturing a light-emitting display device, according to an exemplary embodiment will hereinafter be described.

FIGS. 5 to 14 illustrate cross-sectional views of stages in a method of manufacturing a light-emitting display device according to the first exemplary embodiment.

The pixels 120 of the display area DA and the pixels 130 of the dummy area DMA may be formed at the same time, and the formation of only the pixels 130 will hereinafter be described. The description of the formation of the pixels 130 is directly applicable to the pixels 120.

Figure 5:
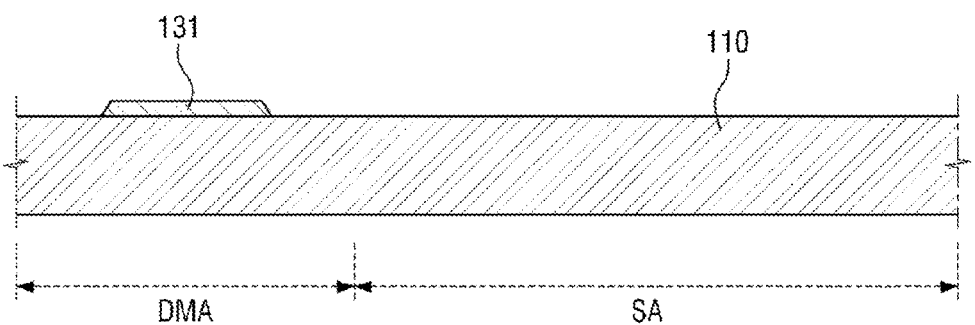
FIGS. 5 to 14 illustrate cross-sectional views of stages in a method of manufacturing a light-emitting display device according to the first exemplary embodiment.

Referring to FIG. 5, the second anode electrode 131 may be formed on the substrate 110 for each of the pixels 130 in the dummy area DMA. The second anode electrode 131 may be formed by depositing a transparent electrode material or a reflective material on the substrate 110 and patterning the deposited material.

Figure 6:
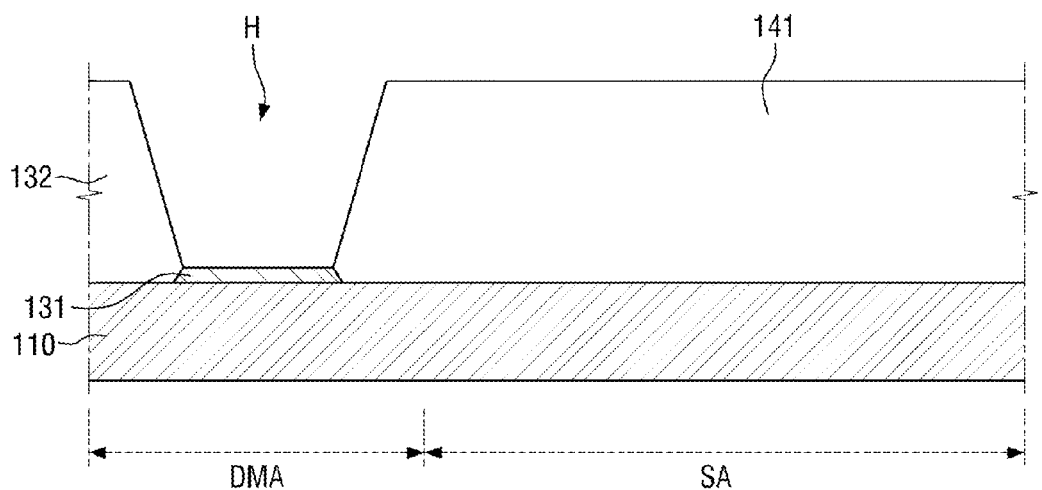

Thereafter, referring to FIG. 6, the second pixel-defining layer 132 of the dummy area DMA and a third pixel-defining layer 141 of the seal area SA may be formed at the same time by depositing an insulating material on the entire surface of the substrate 110 to cover the second anode electrode 131 of the dummy area DMA. For example, the second pixel-defining layer 132 of the dummy area DMA may extend into the seal area SA. For a proper distinction, even the same elements may be referred to by different reference numerals, from area to area. The surface of the substrate 110 may include the seal area SA. The surface of the substrate 110 may also include the display area DA and the line area LA. Thereafter, by patterning the second pixel-defining layer 132 of the dummy area DMA, an opening H may be formed to expose the top surface of the second anode electrode 131 therethrough.

Figure 7:
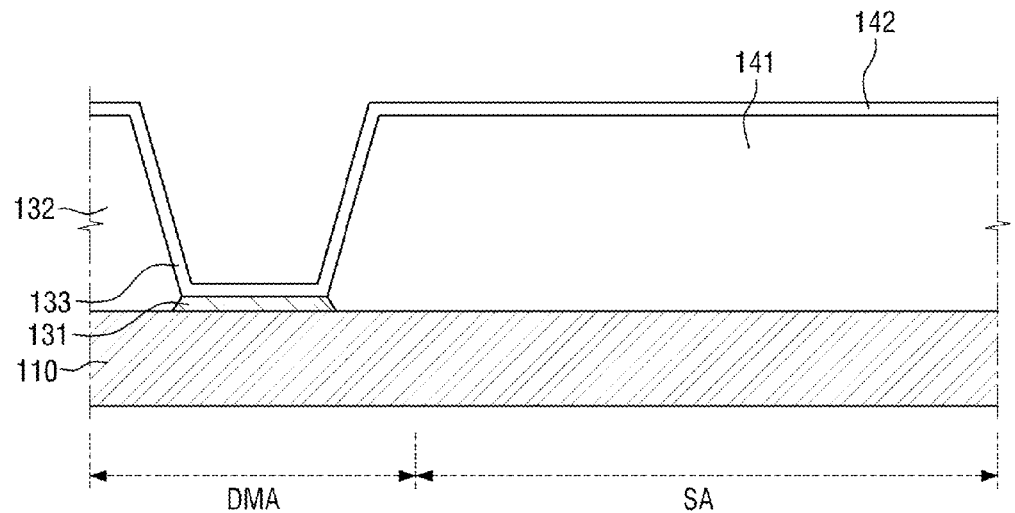

Thereafter, referring to FIG. 7, the second hole injection layer 133 and a third hole injection layer 142 may be formed by conformally depositing a hole injection material along the surface of the second pixel-defining layer 132 with the opening H, through which the top surface of the second anode electrode 131 is exposed, and along the surface of the third pixel-defining layer 141, which is formed on the seal area SA. The hole injection material may be a lyophobic material.

Figure 8:
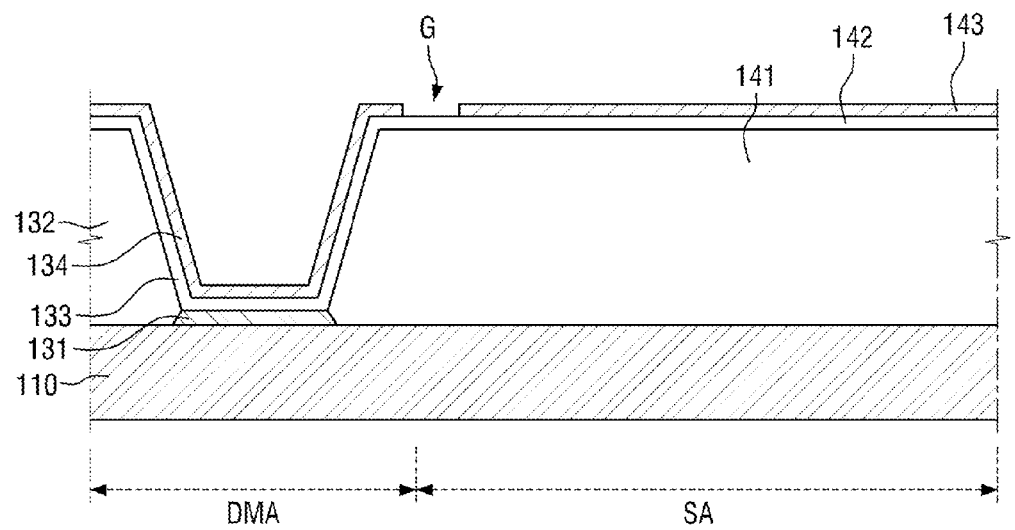

Thereafter, referring to FIG. 8, the second surface treatment layer 134 and a third surface treatment layer 143 may be formed on the dummy area DMA (where the second hole injection layer 133 is formed) and the seal area SA (where the third hole injection layer 142 is formed), respectively. A groove G may be formed between the second surface treatment layer 134 and the third surface treatment layer 143. The groove G may expose the surface of the second or third hole injection layer 133 or 142 between the dummy area DMA and the seal area SA. The second or third hole injection layer 133 or 142 may be formed of a lyophobic material, and a solution (e.g., organic liquid) ejected or provided over or onto the dummy area DMA or the seal area SA, e.g., a hole transport layer solution (135a of FIG. 9) ejected from a first ejector (150 of FIG. 9) or a light-emitting layer solution (136a of FIG. 11) ejected from a second ejector (160 of FIG. 11) may be prevented from escaping the dummy area DMA or the seal area SA. The groove G may be formed by photolithography. The display area DA or the dummy area DMA may have both a pattern area (PA of FIG. 2) and a non-pattern area (NPA of FIG. 2), e.g., a lyophilic area and a lyophobic area, defined on a pixel-by-pixel basis, and the seal area SA may have only a lyophilic area or a pattern area (PA of FIG. 2) defined across the entire surface thereof (rather than on the pixel-by-pixel basis) because of the third surface treatment layer 143 formed thereon. The third surface treatment layer 143 may be formed so as for the entire seal area SA to have lyophilicity, and a third hole transport layer (144 of FIG. 10) and a third light-emitting layer (145 of FIG. 12) may be uniformly formed. Accordingly, organic materials formed on the seal area SA may be uniformly etched. The second surface treatment layer 134 and the third surface treatment layer 143 may be formed of a conductive primer so as to be more lyophilic than the second and third hole injection layers 133 and 142 with respect to the hole transport layer solution 135a.

Figure 9:
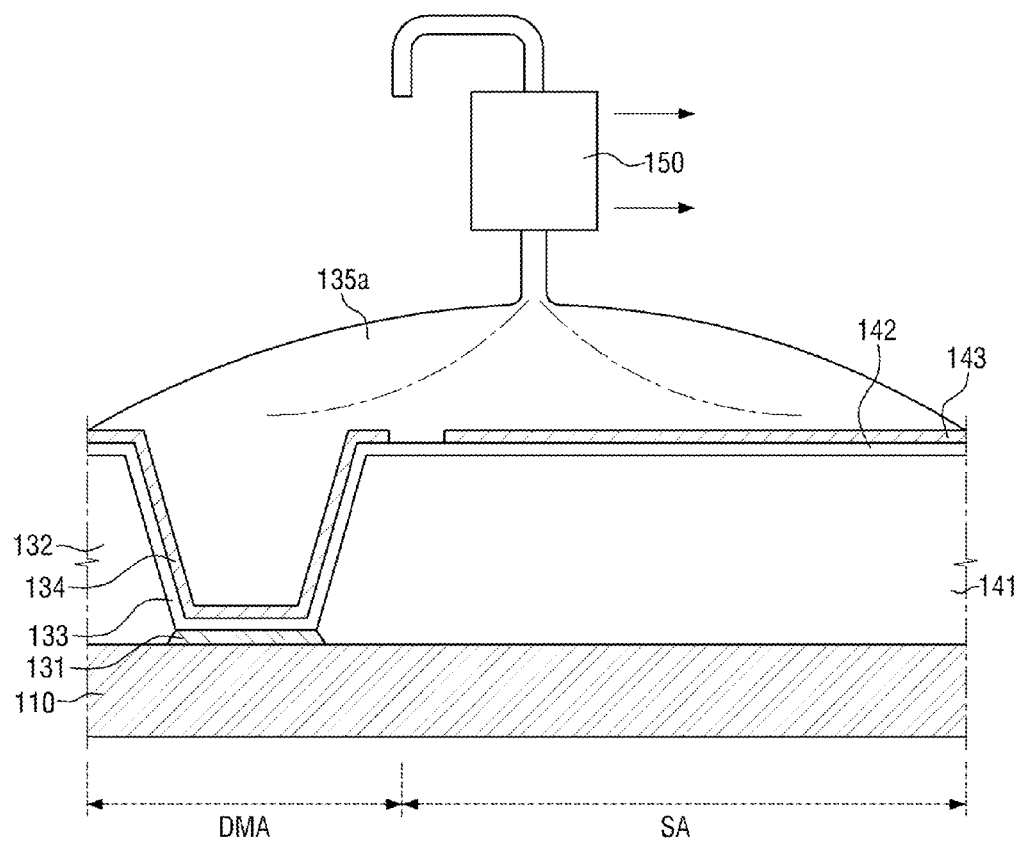

Thereafter, referring to FIG. 9, the hole transport layer solution 135a may be ejected from the first ejector 150 onto the second surface treatment layer 134 of the dummy area DMA and the third surface treatment layer 143 of the seal area SA through inkjet printing or nozzle printing. In an implementation, as illustrated in FIG. 9, the hole transport layer solution 135a may initially cover all surfaces of the dummy area DMA and seal area SA, before settling in predetermined locations due to the lyophilicity and lyophobicity of the underlying layers. For example, the hole transport layer solution 135a may be an organic liquid (e.g., may have an affinity for a lyophilic material), and the hole transport layer solution 135a may not spread to or remain on the groove G between the dummy area DMA and the seal area SA. The dummy area DMA (where the second surface treatment layer 134 is formed) may have a high wettability, and the hole transport layer solution 135a may be stably contained within the second pixel-defining layer 132 where the opening H is formed, and may uniformly spread over the entire surface of the seal area SA.

Figure 10:
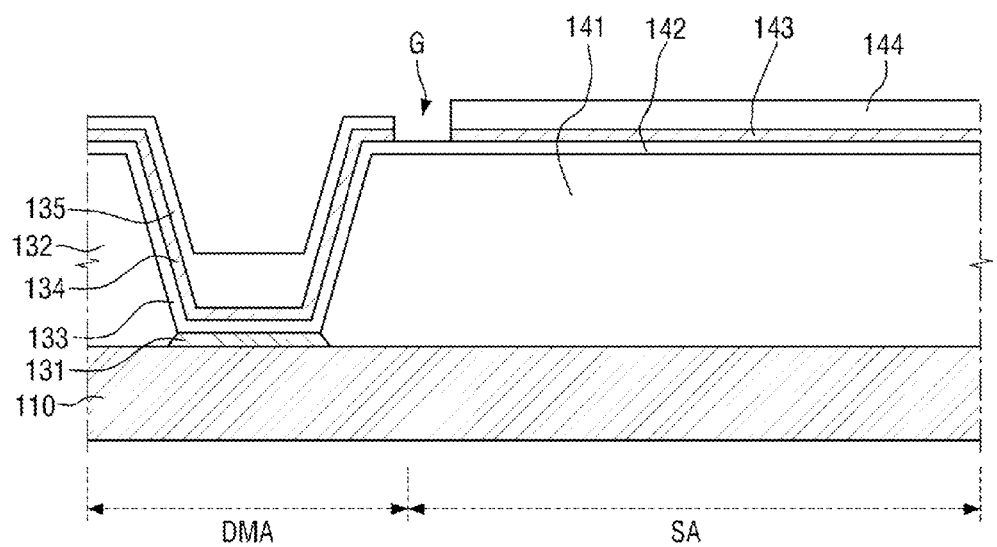

Thereafter, referring to FIG. 10, the second hole transport layer 135 and a third hole transport layer 144 may be formed on the second surface treatment layer 134 of the dummy area DMA and the third surface treatment layer 143 of the seal area SA, respectively, by drying the hole transport layer solution 135a.

Figure 11:
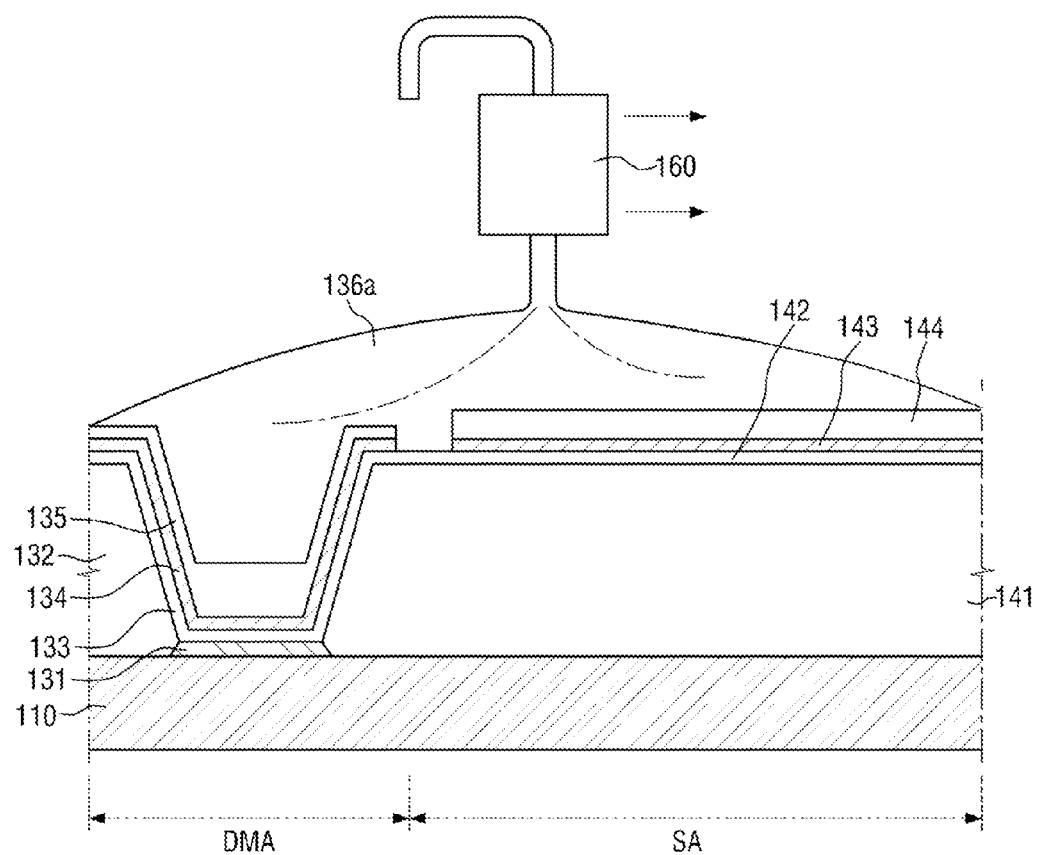

Thereafter, referring to FIG. 11, the light-emitting layer solution 136a may be ejected from the second ejector 160 onto the second hole transport layer 135 of the dummy area DMA and the third hole transport layer 144 of the seal area SA through inkjet printing or nozzle printing. In an implementation, as illustrated in FIG. 11, the light-emitting layer solution 136a may initially cover all surfaces of the dummy area DMA and seal area SA, before settling in predetermined locations due to the lyophilicity and lyophobicity of the underlying layers. For example, the light-emitting layer solution 136a may be an organic liquid (e.g., may have an affinity for a lyophilic material), and the light-emitting layer solution 136a may not spread to or remain in the groove G between the dummy area DMA and the seal area SA. The dummy area DMA (where the second surface treatment layer 134 is formed) may have a high wettability, and the light-emitting layer solution 136a may be stably contained within the second pixel-defining layer 132 where the opening H is formed, and may uniformly spread over the seal area SA, e.g., over the third hole transport layer 144.

Figure 12:
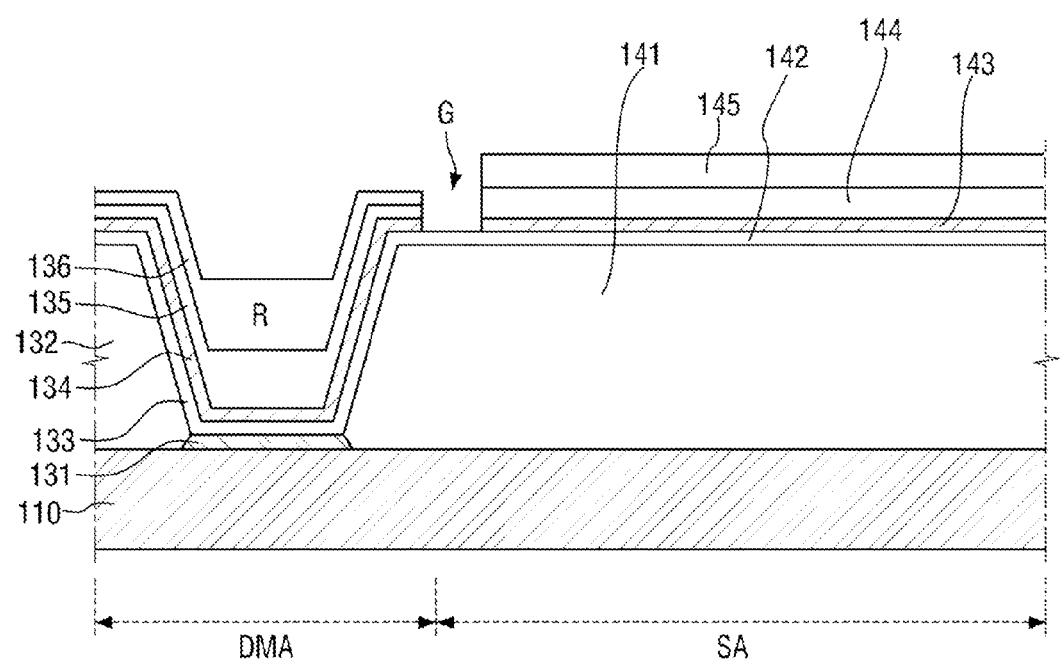

Thereafter, referring to FIG. 12, the second light-emitting layer 136 and a third light-emitting layer 145 may be formed on the second hole transport layer 135 of the dummy area DMA and the third hole transport layer 144 of the seal area SA, respectively, by drying the light-emitting layer solution 136a.

Figure 13:
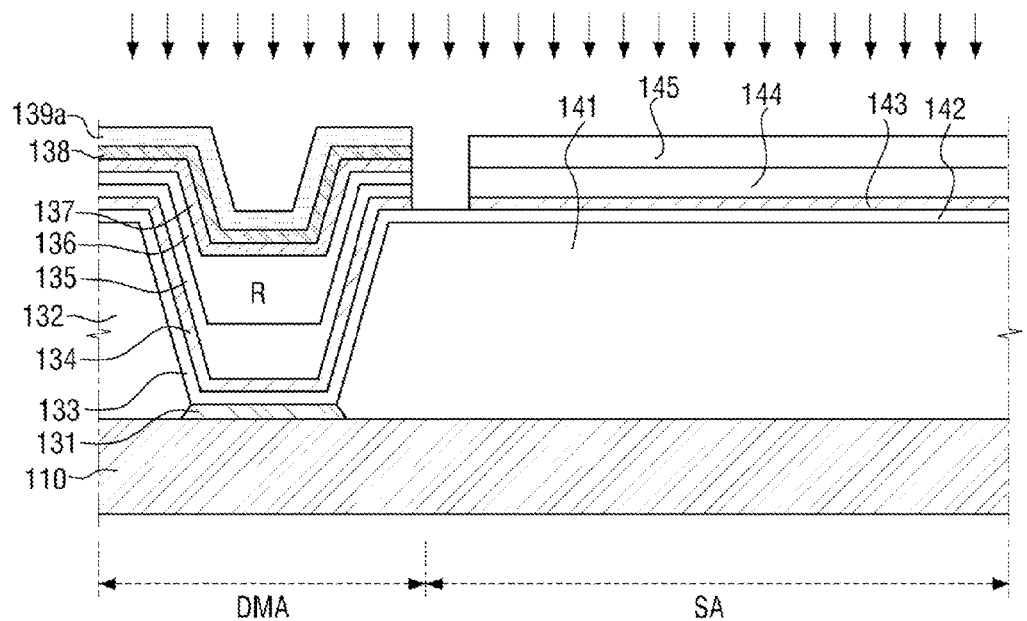

Thereafter, referring to FIG. 13, the second electron transport layer 137 and the second electron injection layer 138 may be sequentially formed on the second light-emitting layer 136 for each of the pixels 130 of the dummy area DMA, and a second cathode electrode material 139a may be formed. The second cathode electrode material 139a may be formed of a transparent electrode material or a reflective material. After the deposition of the second cathode electrode material 139a only in the dummy area DMA, the patterns formed in the seal area SA may be etched, e.g., the second cathode electrode material 139a may be understood to serve as a pattern mask. For example, the patterns formed in the dummy area DMA may not be etched due to the presence of the second cathode electrode material 139a thereon, and only the patterns formed in the seal area SA may be etched.

Figure 14:
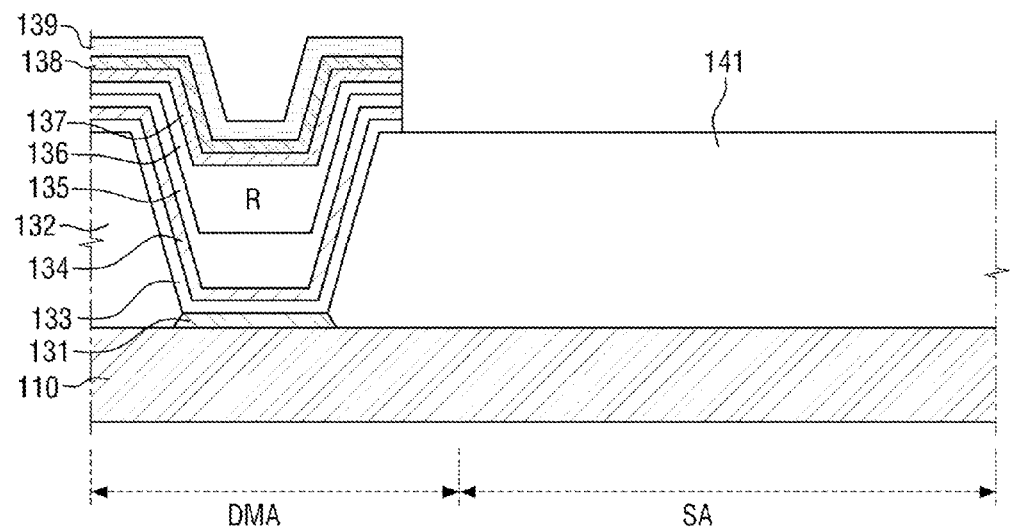

Referring to FIG. 14, after the etching of the patterns in the seal area SA, another second cathode electrode material 139a may be deposited onto the dummy area DMA and may be patterned, thereby forming a second cathode electrode 139.

As described above, the third surface treatment layer 143 may be formed on the entire surface of the seal surface SA, without regard to distinctions between the pixels 130, using a lyophilic material, and the third hole transport layer 144 and the third light-emitting layer 145 may be sequentially formed on the third surface treatment layer 143 to each have a uniform thickness, i.e., to each form a planarization layer. Accordingly, the patterns formed in the seal area SA may be uniformly removed by etching.

An exemplary embodiment where the surface of the seal area SA of the display substrate 100 is treated with a lyophobic material will hereinafter be described with reference to FIGS. 15 to 27.

Figure 15:
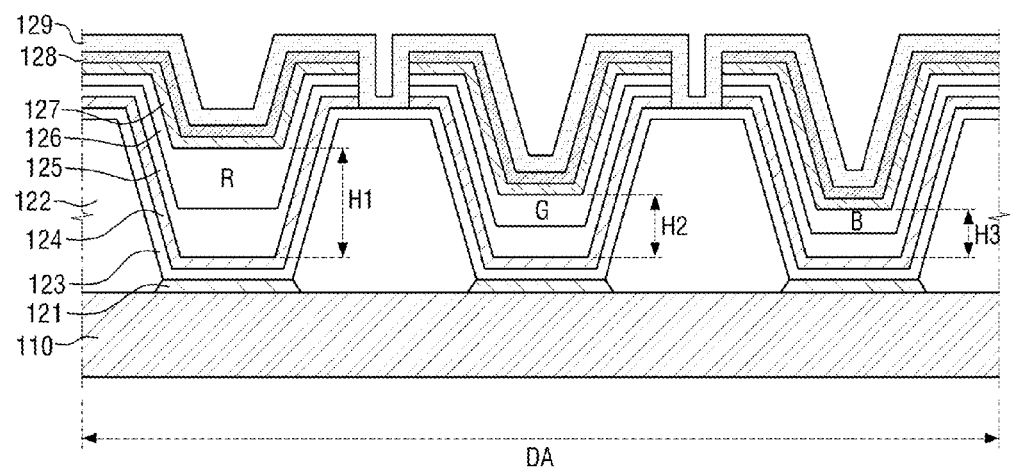
FIG. 15 illustrates a cross-sectional view of a display substrate according to a second exemplary embodiment, taken along line I-I' of FIG. 2.
Figure 16:
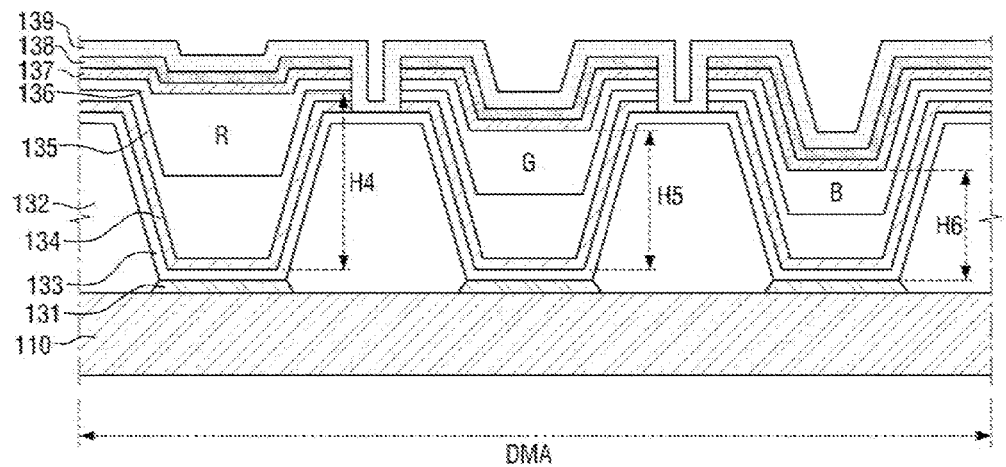
FIG. 16 illustrates a cross-sectional view of the display substrate according to the second exemplary embodiment, taken along line II-II' of FIG. 2.

FIG. 15 illustrates a cross-sectional view of a display substrate according to a second exemplary embodiment, taken along line I-I' of FIG. 2. FIG. 16 illustrates a cross-sectional view comparing heights/thicknesses of pixels in a display area and the heights/thicknesses of pixels in a dummy area.

Referring to FIGS. 15 and 16, a display substrate 100 may include a display area DA, a dummy area, a seal area SA, and a line area LA. The display substrate 100 of FIGS. 15 and 16 has the same structure as the display substrate 100 of FIGS. 3 and 4 except that pixels 120 formed in the display area DA have different heights from one another and from pixels 130 formed in the dummy area DMA, and thus, detailed descriptions of elements that the display substrate 100 of FIGS. 15 and 16 and the display substrate 100 of FIGS. 3 and 4 have in common, i.e., descriptions of pattern elements formed in display area DA, pattern elements formed in the dummy area DMA, pattern elements formed in the seal area SA and pattern elements formed in the line area LA, may be omitted.

Referring to FIG. 15, light-emitting patterns that form each of the pixels 120 formed on the substrate 110 in the display area DA, e.g., a first hole transport layer 125 and a first light-emitting layer 126, may have different thicknesses or heights (e.g., from the surface treatment layer 124) for different colors of light-emitting layers. For example, the first hole transport layer 125 and the first light-emitting layer 126 may have a height H1 in an R light-emitting layer R, may have a height H2 in a G light-emitting layer G, and may have a height H3 in a B light-emitting layer B. The R, G and B light-emitting layers R, G and B may have different wavelengths, and the first hole transport layer 125 and the first light-emitting layer 126 may be formed to have different heights or thicknesses for different colors of light-emitting layers in order to help improve display quality.

Referring to FIG. 16, light-emitting patterns that form each of the pixels 130 on the substrate 110 of the dummy area DMA, e.g., a second hole transport layer 135 and a second light-emitting layer 136, have different heights or thicknesses of light-emitting layers. For example, the second hole transport layer 135 and the second light-emitting layer 136 may have a height H4 in an R light-emitting layer R, may have a height H5 in a G light-emitting layer G, and may have a height H6 in a B light-emitting layer B.

The R, G and B light-emitting layers R, G and B that form the pixels 120 in the display area DA may have a different height or thicknesses from the R, G and B light-emitting layers R, G and B that form the pixels 130 of the dummy area DMA. For example, the R, G and B light-emitting layers R, G and B in the display area DA may be higher or thicker than the R, G and B light-emitting layers R, G and B in the dummy area DMA. For example, H1<H4, H2<H5, and H3<H6. The surface of the seal area SA may be treated to have lyophobicity during the fabrication of the display substrate 100, and a hole transport layer solution (135a of FIG. 22) and a light-emitting layer solution (136a of FIG. 24) may flow into the dummy area DMA, instead of being formed on the seal area SA, and this will hereinafter be described in detail in connection with a method of manufacturing a light-emitting display device according to the second exemplary embodiment.

FIGS. 17 to 27 illustrate cross-sectional views of stages in a method of manufacturing a light-emitting display device according to the second exemplary embodiment.

Figure 17:
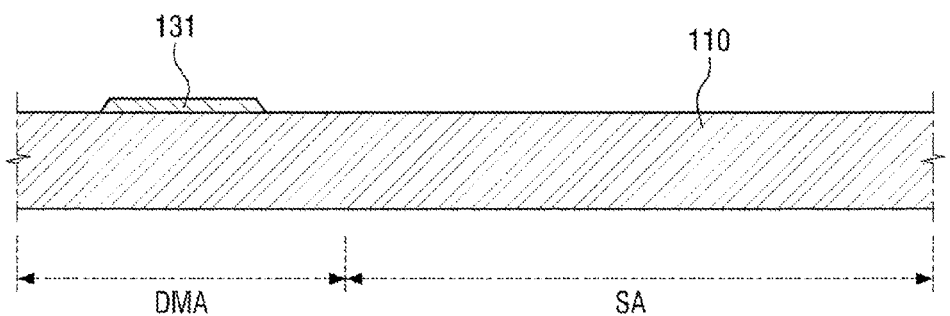
FIGS. 17 to 27 illustrate cross-sectional views of stages in a method of manufacturing a light-emitting display device according to the second exemplary embodiment.

Referring to FIG. 17, the second anode electrode 131 may be formed on the substrate 110 for each of the pixels 130 of the dummy area DMA. The second anode electrode 131 may be formed by depositing a transparent electrode material or a reflective material on the substrate 110 and patterning the deposited material.

Figure 18:
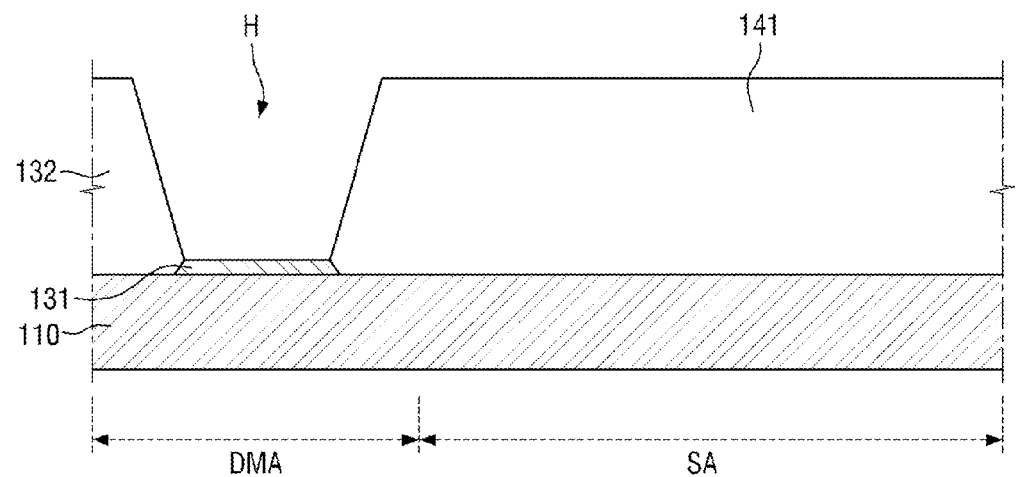

Thereafter, referring to FIG. 18, the second pixel-defining layer 132 of the dummy area DMA and a third pixel-defining layer 141 of the seal area SA may be formed at the same time by depositing an insulating material on the entire surface of the substrate 110 to cover the second anode electrode 131 of the dummy area DMA. For example, the second pixel-defining layer 132 of the dummy area DMA may extend into the seal area SA. For a proper distinction, even the same elements may be referred to by different reference numerals, from area to area. The surface of the substrate 110 may include the seal area SA. In an implementation, the surface of the substrate 110 may also include the display area DA and the line area LA. Thereafter, by patterning the second pixel-defining layer 132 of the dummy area DMA, an opening H may be formed to expose the top surface of the second anode electrode 131 therethrough.

Figure 19:
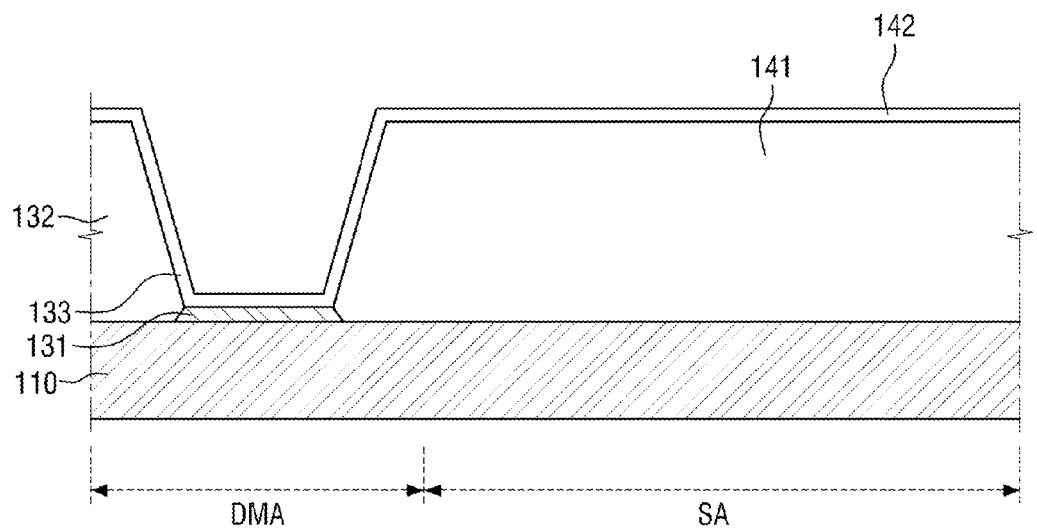

Thereafter, referring to FIG. 19, the second hole injection layer 133 and a third hole injection layer 142 may be formed by depositing a hole injection material onto the second anode electrode 131 and the second pixel-defining layer 132 of the dummy area DMA and onto the third pixel-defining layer 141 of the seal area SA.

Figure 20:
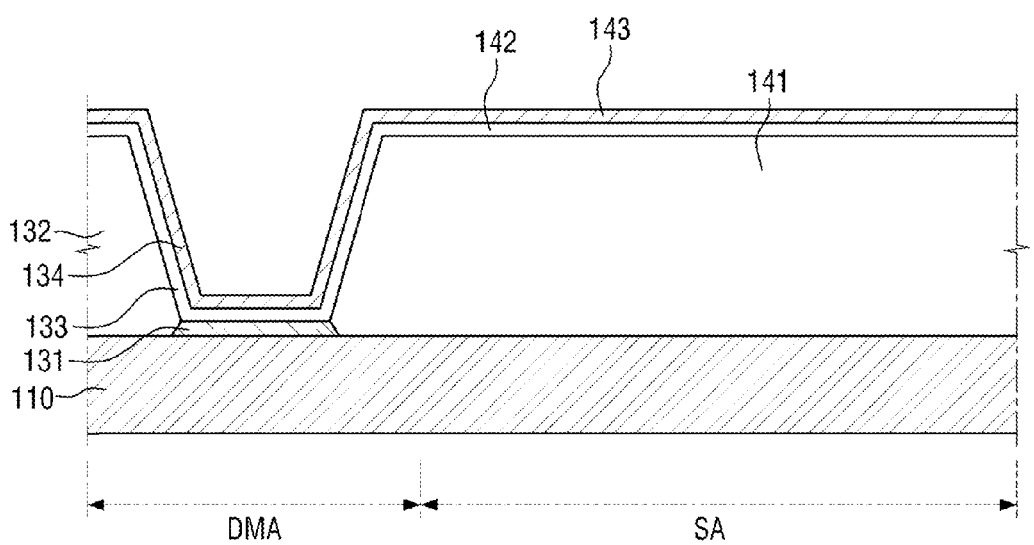

Thereafter, referring to FIG. 20, the second surface treatment layer 134 and a third surface treatment layer 143 may be formed on the entire dummy area DMA (where the second hole injection layer 133 is formed) and the entire seal area SA (where the third hole injection layer 142 is formed), respectively. The second surface treatment layer 134 and the third surface treatment layer 143 may be formed of a conductive primer so as to be more lyophilic than the second and third hole injection layers 133 and 142 (e.g., with respect to the hole transport layer solution 135a).

Figure 21:
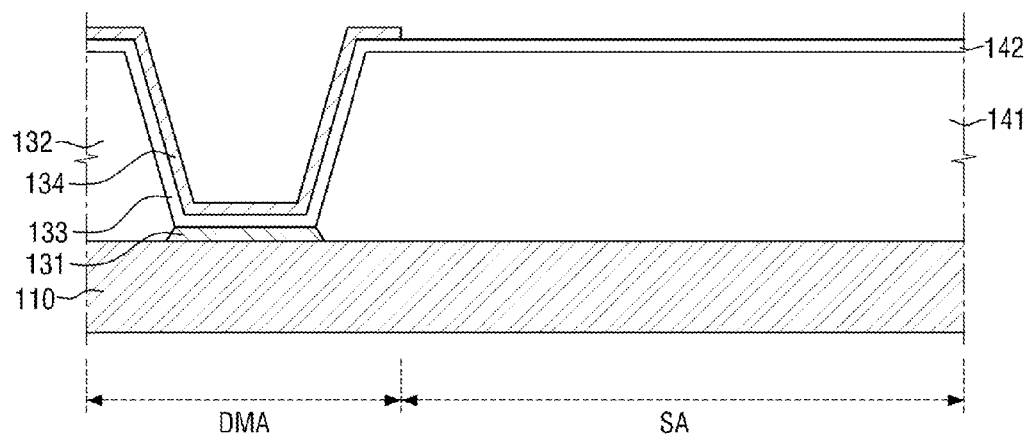

Thereafter, referring to FIG. 21, the third surface treatment layer 143 may be etched through photolithography so as for the surface of the seal area SA to have lyophobicity. Each of the display area DA and the dummy area DMA may have both a lyophilic area (PA of FIG. 2) and a lyophobic area (NPA of FIG. 2) defined on a pixel-by-pixel basis, and the seal area SA may have only a lyophobic area (NPA of FIG. 2) defined across the entire surface thereof, rather than on the pixel-by-pixel basis. The surface of the seal area SA may have lyophobicity, and the hole transport layer solution 135a or the light-emitting layer solution 136a (e.g., organic liquids) may not remain after being deposited on the seal area SA. Accordingly, a sealant 300 may be uniformly formed, and an amount of time that it takes to perform etching may be reduced, compared to the case when the surface of the seal area SA is treated to have lyophilicity.

Figure 22:
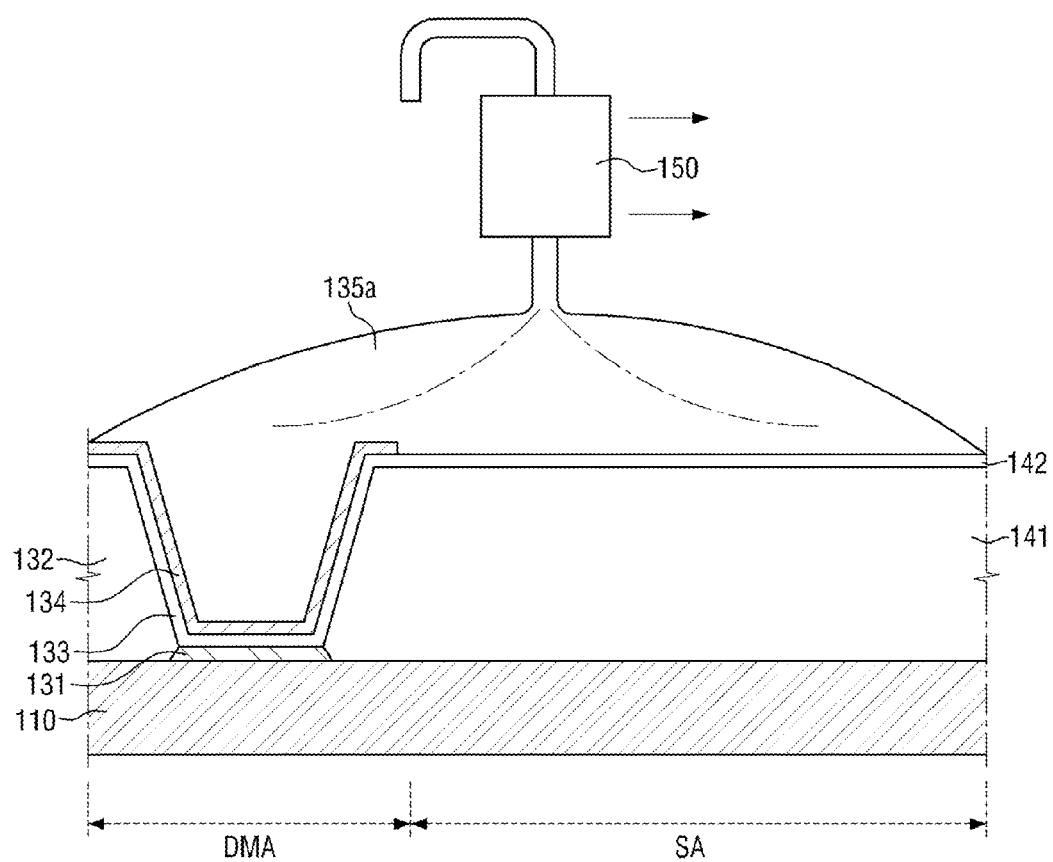

Thereafter, referring to FIG. 22, the hole transport layer solution 135a may be ejected from the first ejector 150 onto the second surface treatment layer 134 of the dummy area DMA and the third surface treatment layer 143 of the seal area SA through inkjet printing or nozzle printing. The dummy area DMA where the second surface treatment layer 134 is formed may have a high wettability, and the hole transport layer solution 135a may be stably contained within the second pixel-defining layer 132 where the opening H is formed. The third hole injection layer 142 (with lyophobicity) may be on the entire surface of the seal area SA (without regard to distinctions between the pixels 130), and the hole transport layer solution 135a initially ejected onto the seal area SA may flow into the dummy area DMA.

Figure 23:
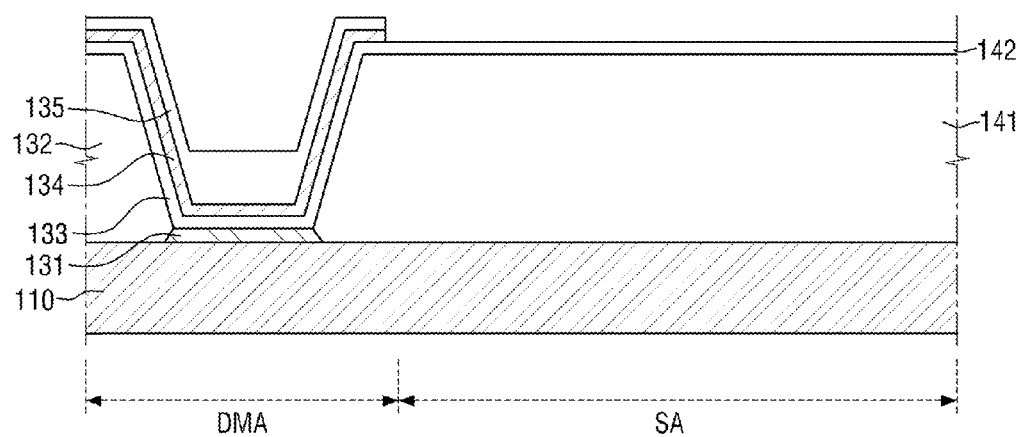

Thereafter, referring to FIG. 23, the second hole transport layer 135 may be formed on the second surface treatment layer 134 of the dummy area DMA by drying the hole transport layer solution 135a.

Figure 24:
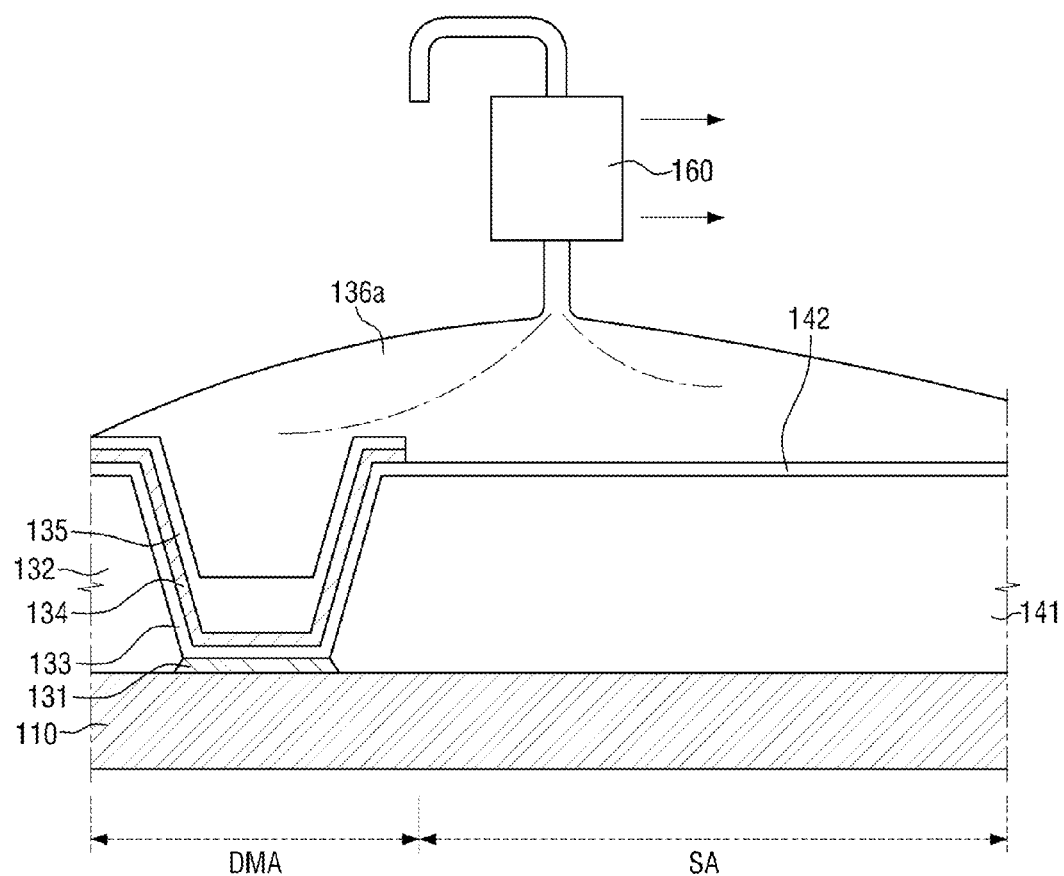

Thereafter, referring to FIG. 24, the light-emitting layer solution 136a may be ejected from the second ejector 160 onto the second hole transport layer 135 of the dummy area DMA through inkjet printing or nozzle printing. The light-emitting layer solution 136a may be an organic liquid (e.g., may have an affinity for a lyophilic material), and the light-emitting layer solution 136a may be formed or may settle on the dummy area DMA where the second surface treatment layer 134 is formed, and not on the seal area SA (which has been treated to have lyophobicity). Accordingly, the light-emitting layer solution 136a may flow into the dummy area DMA, instead of being formed or remaining on the seal area SA. Accordingly, the R, G and B light-emitting layers R, G and B corresponding to the pixels 130 of the dummy area DMA may be formed to be higher than the R, G and B light-emitting layers R, G and B corresponding to the pixels 120 of the display area DA.

Figure 25:
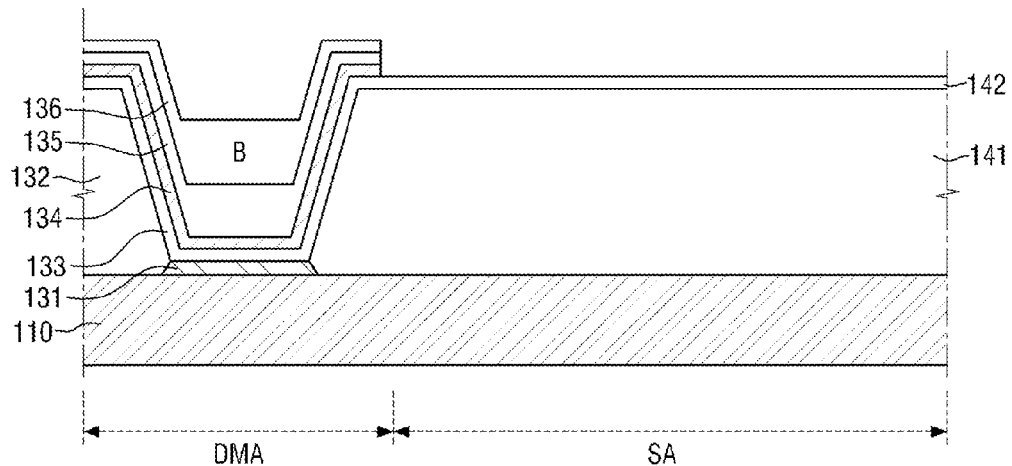

Thereafter, referring to FIG. 25, the second light-emitting layer 136 may be formed on the second hole transport layer 135 of the dummy area DMA, by drying the light-emitting layer solution 136a.

Figure 26:
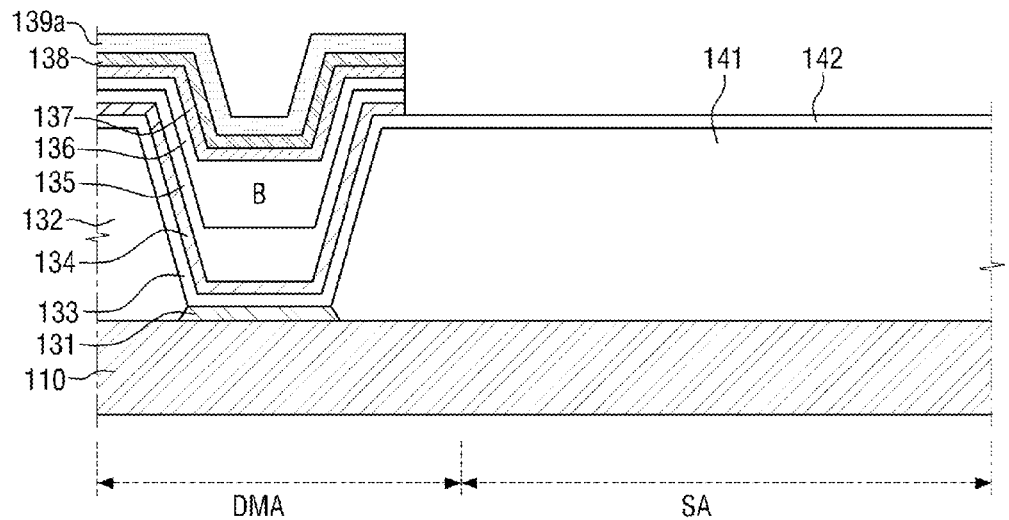

Thereafter, referring to FIG. 26, the second electron transport layer 137 and the second electron injection layer 138 may be sequentially formed on the second light-emitting layer 136 for each of the pixels 130 of the dummy area DMA, and a second cathode electrode material 139a may be formed. The second cathode electrode material 139a may be formed of a transparent electrode material or a reflective material. After the deposition of the second cathode electrode material 139a only in the dummy area DMA, the third hole injection layer 142 of the seal area SA may be etched, in which case, the second cathode electrode material 139a may be understood to serve as a pattern mask. For example, the patterns formed in the dummy area DMA may not be etched due to the presence of the second cathode electrode material 139a thereon, and only the third hole injection layer 142 of the seal area SA may be etched. Accordingly, the surface of the seal area SA may be treated to have lyophobicity, and the amount of time that it takes to perform etching may be reduced, compared to the case when the surface of the seal area SA is treated to have lyophilicity.

Figure 27:
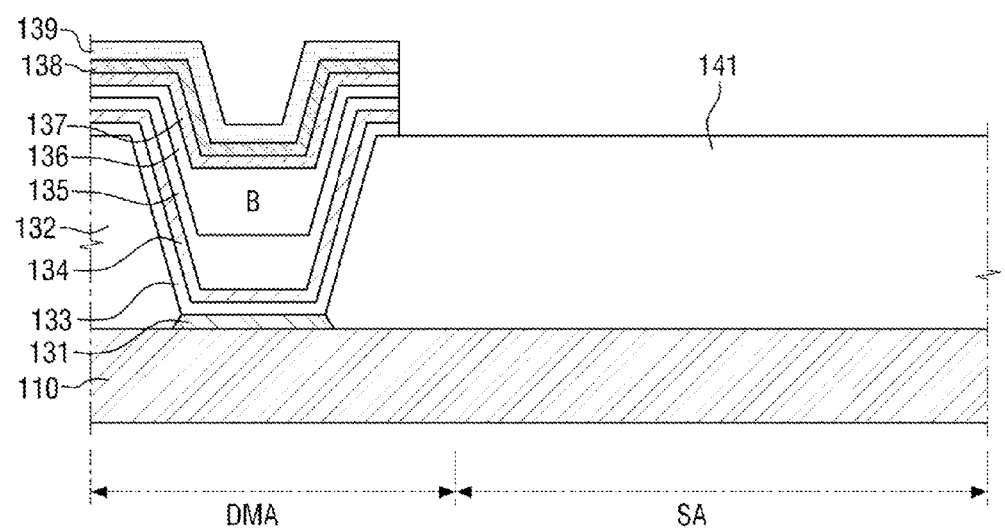

Referring to FIG. 27, after the etching of the third hole injection layer 142 of the seal area SA, another second cathode electrode material 139a may be deposited onto the dummy area DMA and is patterned, thereby forming a second cathode electrode 139.

By way of summation and review, organic materials and electrodes used in the OLED display device, particularly, OLEDs, could easily deteriorate upon exposure to moisture and oxygen, thereby considerably degrading the emission characteristics and lifetime of the OLED display device.

Accordingly, an encapsulating substrate, which may face a display substrate where a plurality of pixels and the OLEDs are arranged and to protect the OLEDs, may be sealed so as to help prevent the infiltration of external moisture or oxygen thereinto.

Therefore, the display substrate and the encapsulating substrate may be bonded and sealed together by forming a sealant along a seal line, which is provided along the sides of the display substrate or the encapsulating substrate.

To improve the sealing of the OLED display device, the sealant may be formed uniformly.

The pixels of the OLED display device may be formed by, e.g., inkjet printing or nozzle printing, in which case, an organic material used to form the pixels may remain on the seal line.

If the organic material were to remain on the seal line, the sealant may not be able to be formed uniformly along the seal line.

Accordingly, an etching process for removing the organic material from the seal line may be performed. If the etching process were to be performed only for a short time, the organic material may not be able to be properly removed. On the other hand, if the etching process were to be continued too long, the organic material may be completely removed, but also the underlying pixel layers (particularly, a thin-film transistor (TFT) layer below the anode electrode of the OLED display device) within the seal line may be affected by the etching process, thereby causing defects in the OLED display device.

The embodiments may provide a light-emitting display device capable of uniformly forming a seal line to help improve sealing capacity.

The embodiments may provide a method of manufacturing a light-emitting display device capable of uniformly forming a seal line to help improve sealing capacity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a light-emitting display device, the method comprising:
    preparing a substrate such that the substrate includes:
        a pixel area in which a plurality of pixels are arranged, and
        a seal area that surrounds the pixel area;
    forming first pixel electrode patterns on the substrate where the pixel area is defined;
    forming insulating patterns on the pixel area and the seal area where the first pixel electrode patterns are formed;
    forming hole injection patterns on the pixel area and the seal area where the insulating patterns are formed;
    forming surface treatment patterns on the pixel area and the seal area where the hole injection patterns are formed;
    forming light-emitting patterns on the pixel area and the seal area where the surface treatment patterns are formed; and
    forming second pixel electrode patterns on the pixel area where the light-emitting patterns are formed,
    wherein forming the surface treatment patterns includes forming the surface treatment patterns on the pixel area and the seal area such that the surface treatment patterns and the hole injection patterns can be alternately arranged on the top surface of the pixel area, and that only the surface treatment patterns can be arranged on the top surface of the seal area.

2. The method as claimed in claim 1, wherein:
    the hole injection patterns are formed of a lyophobic material, and
    the surface treatment patterns are formed of a lyophilic material.

3. The method as claimed in claim 2, wherein the surface treatment patterns are formed of a conductive primer.

4. The method as claimed in claim 1, wherein forming the light-emitting patterns includes forming the light-emitting patterns using one of an inkjet printing method or a nozzle printing method.

5. The method as claimed in claim 1, wherein forming the surface treatment patterns includes forming a plurality of grooves to define the pixels arranged in the pixel area and to expose the hole injection patterns therethrough.

6. The method as claimed in claim 4, wherein forming the light-emitting patterns further includes:
    forming a hole transport layer on the pixel area and the seal area where the surface treatment patterns are formed; and
    forming a light-emitting layer on the pixel area and the seal area where the hole transport layer is formed.

7. The method as claimed in claim 1, further comprising, after the forming the second pixel electrode patterns:
    etching the hole injection patterns, the surface treatment patterns, and the light-emitting patterns from the seal area by using the second pixel electrode patterns as a pattern mask.

8. A method of manufacturing a light-emitting display device, the method comprising:
    preparing a substrate such that the substrate includes:
        a pixel area in which a plurality of pixels are arranged, and
        a seal area that surrounds the pixel area;
    forming first pixel electrode patterns on the substrate where the pixel area is defined;
    forming insulating patterns on the pixel area and the seal area where the first pixel electrode patterns are formed;
    forming hole injection patterns on the pixel area and the seal area where the insulating patterns are formed;
    forming surface treatment patterns on the pixel area and the seal area where the hole injection patterns are formed;
    etching the surface treatment patterns from the seal area so as to expose the hole injection patterns on a top surface of the seal area;
    forming light-emitting patterns on the pixel area; and
    forming second pixel electrode patterns on the pixel area where the light-emitting patterns are formed.

9. The method as claimed in claim 8, wherein:
    the hole injection patterns are formed of a lyophobic material, and
    the surface treatment patterns are formed of a lyophilic material.

10. The method as claimed in claim 8, wherein the surface treatment patterns are formed of a conductive primer.

11. The method as claimed in claim 8, wherein forming the light-emitting patterns includes forming the light-emitting patterns using one of an inkjet printing method and a nozzle printing method.

12. The method as claimed in claim 8, wherein etching the surface treatment patterns includes etching the surface treatment patterns from the seal area and, at the same time, forming a plurality of grooves to define the pixels arranged in the pixel area and to expose the hole injection patterns therethrough.

13. The method as claimed in claim 11, wherein forming the light-emitting pattern further includes:
    forming a hole transport layer on the pixel area and the seal area where the surface treatment patterns are formed; and forming a light-emitting layer on the pixel area and the seal area where the hole transport layer is formed.

14. The method as claimed in claim 13, wherein:
the pixel area includes:
a display area in a middle of the substrate, and
a dummy area between the display area and the seal area, and
the light-emitting patterns of the pixels in the display area are formed to have different heights from the light-emitting patterns of the pixels in the dummy area.

15. The method as claimed in claim 14, wherein pixels in the dummy area are formed to be higher than pixels in the display area.

16. The method as claimed in claim 8, further comprising, after forming the second pixel electrode patterns, etching the hole injection patterns from the seal area by using the second pixel electrode patterns as a pattern mask.

17. A light-emitting display device, comprising:
a pixel area, the pixel area including:
a plurality of display pixels in a middle of a substrate, and
a plurality of dummy pixels surrounding the display pixels; and
a seal area surrounding pixel area and having a sealant formed therein, wherein:
the display pixels include first light-emitting patterns,
the dummy pixels include second light-emitting patterns that emit same colors as the first light-emitting patterns,
the first light-emitting patterns have a smaller height than the second light-emitting patterns that are disposed near the seal area, and
the sealant does not overlap the first light-emitting patterns.

18. The light-emitting display device as claimed in claim 17, wherein each of the first light-emitting patterns and the second light-emitting patterns includes:
a hole transport layer delivering holes provided thereto from an anode electrode formed on the substrate; and
a light-emitting layer formed on the hole transport layer and emitting light.

19. The light-emitting display device as claimed in claim 17, wherein the seal area is treated so as for the top surface thereof to have lyophobicity, before formation of the sealant.

20. The light-emitting display device as claimed in claim 17, wherein the sealant is frit that includes fine glass particles.

* * * * *